United States Patent [19]

Ueno et al.

[11] Patent Number: 4,797,583

[45] Date of Patent: Jan. 10, 1989

[54] LEVEL CONVERTING CIRCUIT FOR CONVERTING VOLTAGE LEVELS, INCLUDING A CURRENT AMPLIFYING ARRANGEMENT

[75] Inventors: Masahiro Ueno; Kozaburo Kurita; Ikuro Masuda, all of Hitachi; Nobuaki Miyakawa, Ibaraki, all of Japan

[73] Assignee: Hitachi, Ltd., Tokyo, Japan

[21] Appl. No.: 683,501

[22] Filed: Dec. 19, 1984

[30] Foreign Application Priority Data

Dec. 20, 1983 [JP] Japan .................................. 58-241642

[51] Int. Cl.[4] ................. H03K 19/092; H03K 19/094; H03K 19/01; H03K 17/04
[52] U.S. Cl. .................................... 307/475; 307/570; 307/446; 330/257; 323/316
[58] Field of Search ........... 307/450, 451, 475, 247 R, 307/570, 571, 576, 585, 264, 355, 290, 291, 443, 446, 448, 455, 362, 364; 323/312, 315, 316, 317; 330/257

[56] References Cited

U.S. PATENT DOCUMENTS

| | | | |
|---|---|---|---|
| 4,103,249 | 7/1978 | Burdick | 330/288 |
| 4,224,539 | 9/1980 | Musa et al. | 307/362 |
| 4,379,267 | 4/1983 | Young | 330/257 X |
| 4,380,710 | 4/1983 | Cohen et al. | 307/475 |
| 4,410,857 | 10/1983 | Olmstead | 330/257 X |
| 4,417,160 | 11/1983 | Schade, Jr. | 307/491 X |
| 4,563,601 | 1/1986 | Asano et al. | 307/475 |
| 4,604,533 | 8/1986 | Miyamoto et al. | 307/355 X |
| 4,629,913 | 12/1986 | Lechner | 307/475 |
| 4,634,890 | 1/1987 | Lee | 307/443 X |

FOREIGN PATENT DOCUMENTS

| | | | |
|---|---|---|---|
| 0146910 | 7/1985 | European Pat. Off. | 307/475 |
| 0115036 | 10/1981 | Japan | 307/475 |
| 0076924 | 5/1982 | Japan | 307/475 |
| 0042937 | 3/1985 | Japan | 307/475 |
| 0004331 | 10/1985 | Japan | 307/475 |

OTHER PUBLICATIONS

Fink et al., *Electronics Engineers' Handbook*, McGraw-Hill Book Company, pp. 16-15 through 16-19, 1982.
Senderowicz et al., "High Performance NMOS Operational Amplifier", IEEE Journal of Solid State Circuits, vol. SC-13, No. 6, pp. 760-766, Dec. 1978.
Hudson et al., *Static Rams*: "An Ecl Compatible 4k CMOS Ram", ISSCC 82, Intel Corp., pp. 248-249, Feb. 12, 1982.
Yukawa, "A Highly Sensitive Strobed Comparator", IEEE Journal of Solid State Circuits, vol. SC-16, No. 2, pp. 109-113, Apr. 1981.
Tietz, "*Halbleiter-Schaltungstechnik*", Jun. 6, 1983.

*Primary Examiner*—Stanley D. Miller
*Assistant Examiner*—David R. Bertelson
*Attorney, Agent, or Firm*—Antonelli, Terry & Wands

[57] ABSTRACT

A level converter for transforming differential input voltages into an output voltage comprises a voltage-current conversion circuit for transforming the differential input voltages into differential currents, a current detection circuit for detecting the differential currents, a current amplifying circuit for amplifying the differential currents in response to the output of the current detection circuit, and a current-voltage conversion circuit for transforming the amplified differential currents into an output voltage, thereby allowing fast operation and drastic level conversion.

15 Claims, 8 Drawing Sheets

LEVEL CONVERTING CIRCUIT FOR CONVERTING VOLTAGE LEVELS, INCLUDING A CURRENT AMPLIFYING ARRANGEMENT

The present invention relates to a level converting circuit and, particularly, to a level converting circuit useful as an ECL-to-CMOS level converter and a memory sense amplifier for transforming differential input voltages into a CMOS drive voltage.

One example of conventional level converting circuits performing differential input to CMOS level conversion is shown in FIG. 1. The arrangement includes npn bipolar transistors Q1–Q3, MOS transistors (metal-oxidesemiconductor transistors or insulated gate field-effect transistors) M1–M4, diodes D1 and D2, and resistors R1 and R2. Differential input voltages are denoted by V1 and V2, the former being the input signal voltage and the latter being the reference voltage, for example, in an ECL to CMOS level converting circuit.

In operation, the output voltage of the differential input stage Q1 and Q2 is modified by a level shift stage consisting of a bipolar transistor Q3 and diodes D1 and D2 so that it matches with the input level of a CMOS inverting amplifier stage consisting of MOS transistors M1 and M2, and the signal is further amplified by the second amplifier stage consisting of MOS transistors M3 and M4. In this circuit arrangement, the inverter stage (M1, M2) cannot have a sufficient amplitude of input, causing one of M1 and M2 to operate in a non saturation region of small $g_m$. This results in a large output impedance, producing a large time constant in conjunction with a parasitic capacitance such as the gate capacitance of MOS transistors M3 and M4 in the following stage, and the level converter does not operate at a satisfactory high speed.

FIG. 2 shows another example of conventional level converting circuits described in publication, ISSCC '82 DIGEST OF TECHNICAL PAPERS, page 249. The arrangement is made up of a differential amplifier stage including MOS transistors M10–M14, a level shift stage including MOS transistors M15–M18, and a voltage amplifier stage of current mirror type including MOS transistors M19–M22. The level shift stage provides some voltage amplification due to the cross connection of the drain and gate of the MOS transistors M17 and M18. The differential input stage has the driving transistors M10 and M11 and loading transistors M12 and M13 all operating in the saturation region, thus providing a large voltage gain. On this account, the mirror effect largely acts on the input capacitance of the driving transistors M10 and M11, and the input signal V1 and V2 are subjected to a considerable time constant created in conjunction with their output impedance, that adversely affects the operation speed.

When the foregoing conventional circuit arrangements deal with very small input voltages V1 and V2 in such cases of a memory sense amplifier and ECL-CMOS converter, the former arrangement lacks the voltage gain, while the latter arrangement suffers in its input capacitance in addition to a high signal source impedance, and a satisfactory operation speed cannot be obtained.

The present invention contemplates to overcome the foregoing prior art deficiencies, and its prime object is to provide a level converting circuit capable of fast operation irrespective of the signal source impedance and the input signal level.

In order to achieve the above objective, the present invention resides characteristically in a signal level converting circuit comprising a voltage-to-current conversion means which transforms differential input voltages into differential currents, a means for detecting the differential currents, a current amplifying means which amplifies the differential currents in response to the output of the current detection means, and a current-to-voltage conversion means which transforms the amplified differential currents into an output voltage.

These and other objects and features of the present invention will become apparent from the description of the following particular embodiments taken in conjunction with the accompanying drawings, in which:

FIGS. 3b, 4b and 5b are graphs showing the characteristics of the corresponding arrangements shown in FIGS. 3a 4a and 5a;

Several embodiments of the invention will now be described in detail.

EMBODIMENT 1

Figure 1:
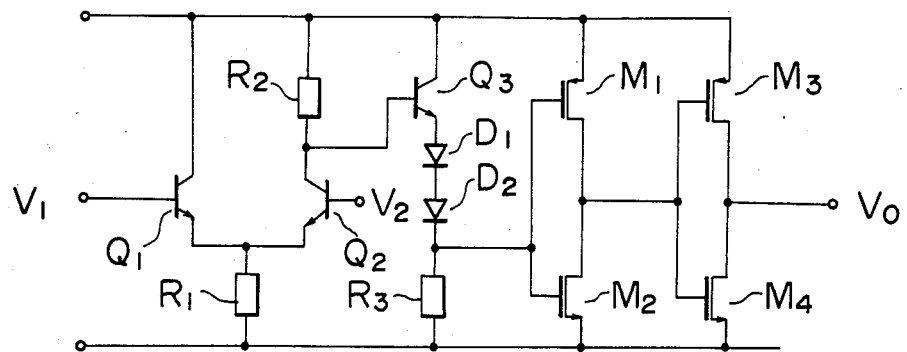
FIGS. 1 and 2 are schematic diagrams showing separate conventional level converting circuits.
Figure 2:
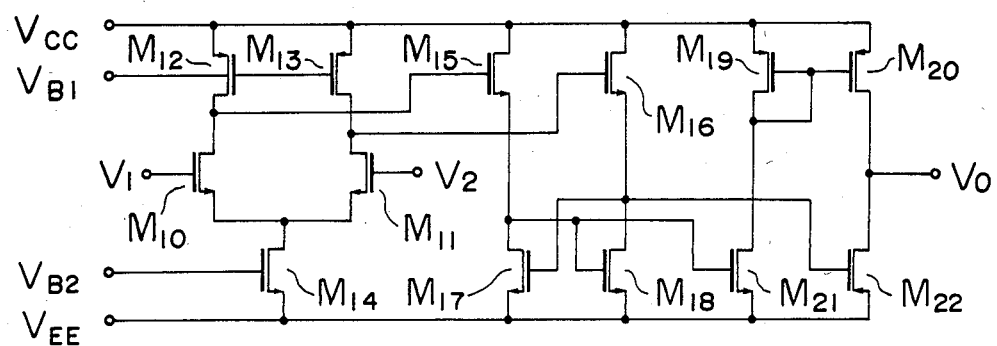
Figure 3A:
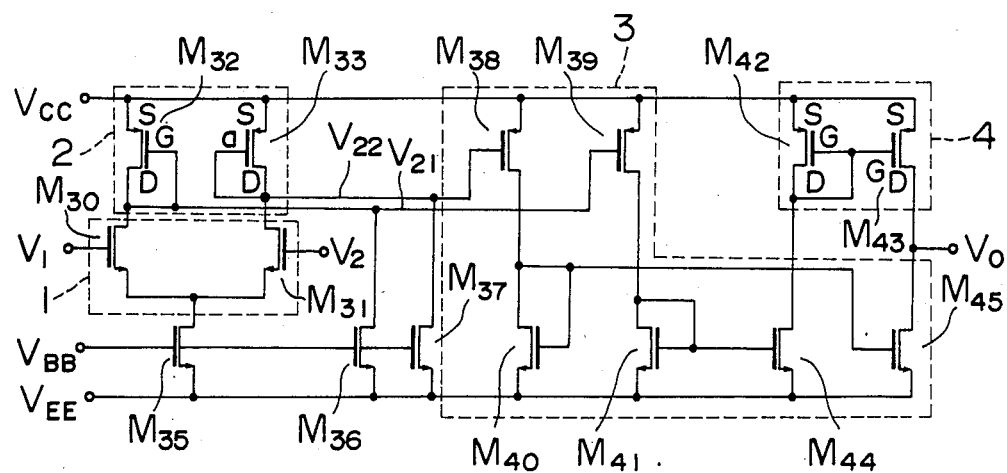
FIGS. 3a, 4a and 5a are schematic diagrams showing embodiments of the present invention.

FIG. 3a shows the first embodiment of the invention, and it is entirely made up of MOS transistors M30–M45. Transistors M30 and M31 in pair form a voltage-to-current conversion circuit 1 which transforms the differential input voltage (V1–V2) into differential currents $Io \pm \Delta Io$. Transistor M35 works as a constant current source which supplies a constant current Io to the conversion circuit 1. Transistors M32 and M33 have their source electrode (S) connected to a power line $V_{CC}$ and their gate (G) connected with their own drain (D) so as to serve as diodes, and they form a current detection circuit 2 for detecting the differential currents. Transistors M36 and M37 operate to provide a constant current bias Ibo for the current detection circuit 2, so that the output voltages V21 and V22 of the current detection circuit 2 are biased to at least $V_{CC} - Vt$ (where Vt represents the threshold voltage of MOS transistor, and it will be treated as the absolute value commonly for all transistors of NMOS and PMOS types).

Figure 3B:
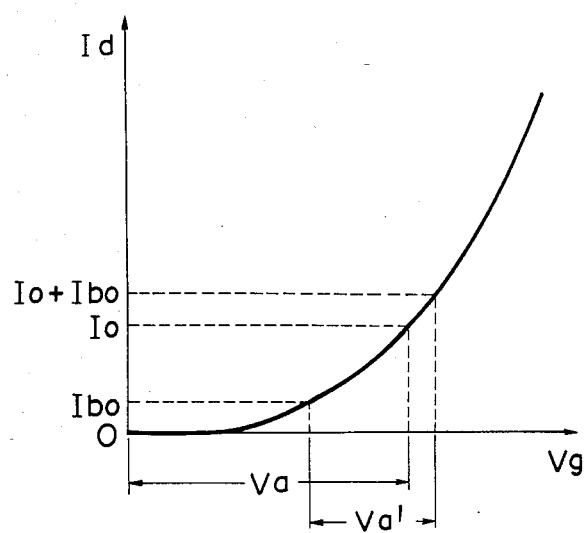

FIG. 3b shows, in a graph of Vg−Id curve of transistors M32 and M33, the effect of the constant current bias Ibo provided for the current detecting transistors M32 and M33. Without the constant current bias Ibo, the transistors M32 and M33 have an amplitude of Va in response to the output current Id of the voltage-current conversion circuit 1 varying between 0 and Io. Whereas, with the constant current bias Ibo given to the transistors M32 and M33, their current Id varies between Ibo and Ibo+Io, resulting in an amplitude of Va' of their output voltages V21 and V22, and thus the output voltage amplitude of the current detection circuit 2 can be made smaller.

According to this embodiment, the output voltage of the current detection circuit 2, and the intermediate and output voltages of the current amplifying circuit 3 are all made to have sufficiently small amplitudes. Therefore, the charging current to the parasitic capacitance is small, and its influence on the delay time of the level converter is very small. The current detection circuit 2 has output voltages V21 and V22 with an amplitude of $Io/g_{ml}$ (where $g_{ml}$ is the mutual conductance of transistors M32 and M33), and it is extremely small as compared with the usual voltage amplifying circuit.

Transistors M38 and M39 form current mirror circuits in conjunction with the current detecting transistors M32 and M33. Similarly, transistors M40, M41, M44 and M45 in combination form other current mirror circuits. The amplitude $\Delta I1$ of the output current I1 flowing in the transistors M44 and M45 is expressed in terms of the mutual conductance $g_{m2}$, $g_{m3}$ and $g_{m4}$ of transistors pairs M38 and M39, M40 and M41, and M44 and M45, respectively, as follows.

$$\Delta I1 = Io\ (g_{m2}/g_{m1})\cdot(g_{m4}/g_{m3}) \quad (1)$$

By imposing a condition, $g_{m2} > g_{m1}$ and $g_{m4} > g_{m3}$, these transistors work for current amplification so that a current amplifying circuit 3 is formed. Transistors M42 and M43 form a mirror circuit constituting a current-to-voltage conversion circuit 4 connected at the output of the current amplifying circuit 3. The transistor M42 has its gate and drain electrodes connected together to form a diode to the gate electrode of the transistor M43, and therefore the conductance of $g_m$ of transistor M43 is determined from the magnitude of current flowing through the transistor M42. If a large current flows in the transistor M42, it produces a large voltage drop, causing the transistor M43 to have an increased gate-source voltage, resulting in an increased $g_m$ of M43. The currents flowing through the transistors M42 and M43 are in a differential relationship, and thus the current through the transistor M43 decreases. Namely, by the duplicated effect of a larger $g_m$ and smaller current, the voltage drop of M43 decreases. Conversely, if the transistor M42 conducts a small current, the transistor M43 has a small $g_m$ and conducts a large current, resulting in an increased voltage drop of M43. The mirror circuit of M42 and M43 constitutes a current-tovoltage conversion circuit 4, with its current sufficiently amplified by the current amplifying circuit 3, and consequently it produces the output voltage Vo with the amplitude large enough to drive CMOS devices.

EMBODIMENT 2

Figure 4A:
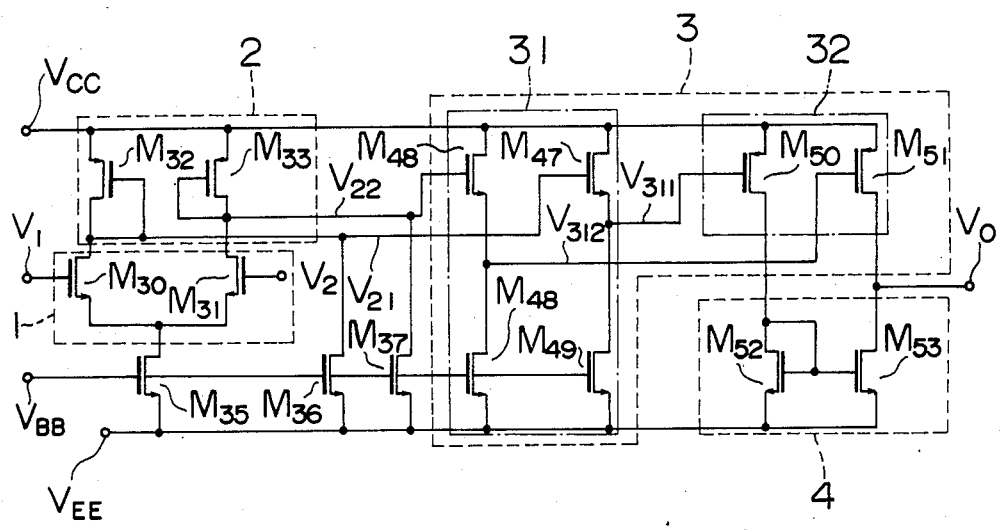

FIG. 4a shows the second embodiment of the invention, in which the same or equivalent components as those shown in FIG. 3a are referred to by the common symbols. In this arrangement, MOS transistors M46-M49 form a level shift circuit 31 which shifts the output voltages V21 and V22 of the current detecting transistors M32 and M33 by a voltage substantially equal to the gate-source voltage $V_L$ of transistors M46 and M47. MOS transistors M50 and M51 form a voltage-current conversion circuit 32 which transforms the output voltages V311 and V312 of the level shift circuit 31 to corresponding currents. The level shift circuit 31 and voltage-current conversion circuit 32 in combination constitute a current amplifying circuit 3. A mirror circuit of MOS transistors M52 and M53 forms a current-voltage conversion circuit 4 which transforms the output of the current amplifying circuit 3 into a voltage signal.

Figure 4B:
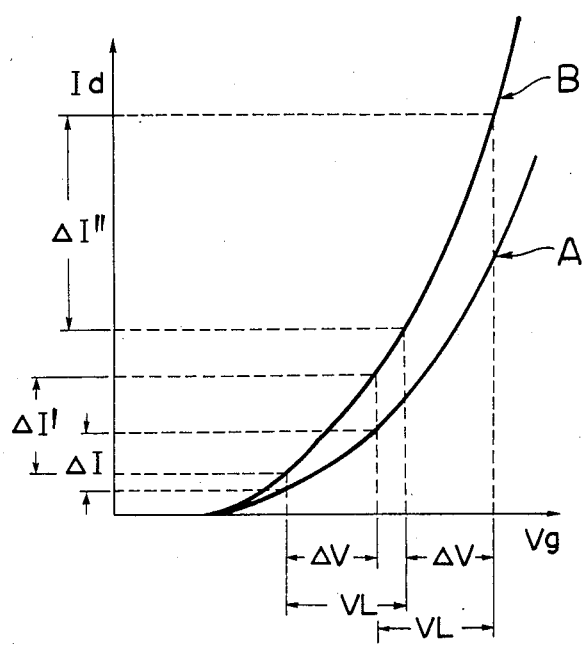

FIG. 4b explains the current detecting and current amplifying operations by the transistors M32, M33 and M46-M51, in which the curve A is the Vg—Id characteristics of the current detecting transistors M32 and M33, and the curve B is the Vg—Id characteristics of the voltage-current converting transistors M50 and M51. If the level shift circuit 31 formed by M46-M49 is absent, M32, M33, M50 and M51 form two current mirror circuits. The current amplitude $\Delta I$ of transistors M32 and M33 is detected as a voltage amplitude $\Delta V$, which is applied to the gate of transistors M50 and M51, then the M50 and M51 perform current amplification for the voltage amplitude $\Delta V$ to produce a current amplitude $\Delta I'$. The current gain in this operation is determined by the ratio of mutual conductance $g_m$ of M32 and M33 to that of M50 and M51. To obtain a large current gain, the ratio of both mutual conductance $g_m$ must be large, and the ratio of physical dimensions of M32, M33, M50 and M51 need to be adjusted.

In this embodiment, the output voltage of the current detection circuit 2 is shifted by $V_L$ through the level shift circuit 31, and the resultant voltage signal is applied to the gate of the transistors M50 and M51. Consequently, the transistors M50 and M51 operate at their large mutual conductance $g_m$, thereby providing a large current amplitude $\Delta I''$.

EMBODIMENT 3

Figure 5A:
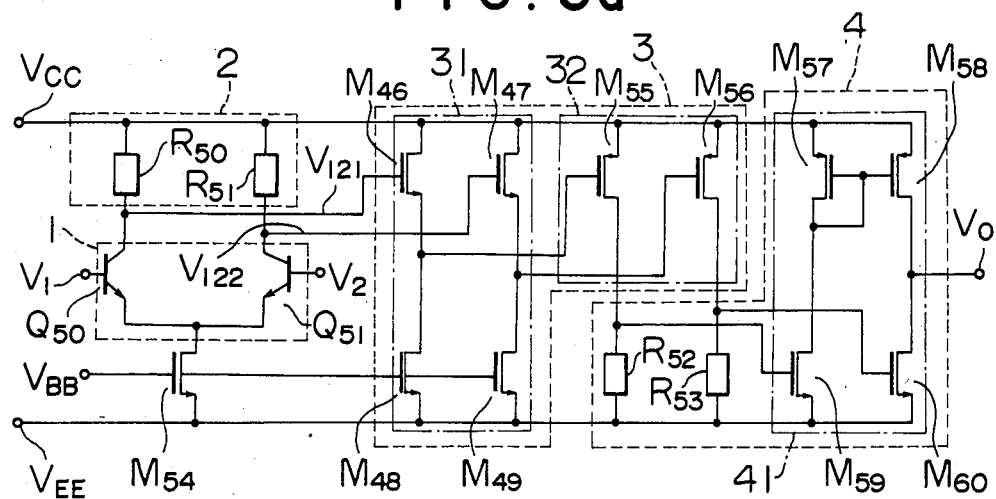

FIG. 5a shows the third embodiment of the invention, in which the same or equivalent components as those shown in FIG. 3a or 4a are referred to by the common symbols. In this embodiment, a pair of npn bipolar transistors Q50 and Q51 form a voltage-current conversion circuit 1, and a MOS transistor M54 is a constant current source for biasing the above differential input stage. Resistors R50 and R51 are used as a current detection circuit 2, transistors M46-M49 form a level shift circuit 31 which shifts the output voltages of the current detection circuit 2 by a value substantially equal to the threshold voltage Vt of MOS transistor, and MOS transistors M55 and M56 form a voltage-current conversion circuit 32 which transforms the output voltages of the level shift circuit 31 into corresponding currents. The level shift circuit 31 and voltage-current conversion circuit 32 in combination constitute a current amplifying circuit 3. Resistors R52 and R53 are load resistors of the current amplifying circuit 3, and MOS transistors M57-M60 form an output buffer circuit 41, these components altogether constituting a current-voltage conversion stage 4.

This arrangement uses bipolar transistors for the voltage-current conversion circuit 1, and the turn-off time of these transistors, if saturated, becomes longer due to the base storage effect, resulting in a considerably increased delay time. On this account, the current detecting resistors R50 and R51 must be chosen to have a sufficiently small value. In consequence, the current detection circuit 2 provides output voltages V121 and V122 with an amplitude of $Vi \pm \Delta Vi$ in a region close to the power voltage $V_{CC}$. The level shift circuit 31 shifts the voltages V121 and V122 by at least the threshold voltage of the output transistors M55 and M56, which then receive an input (gate) voltage of $Vt + Vi \pm \Delta Vi$ and perform current amplification.

Figure 5B:
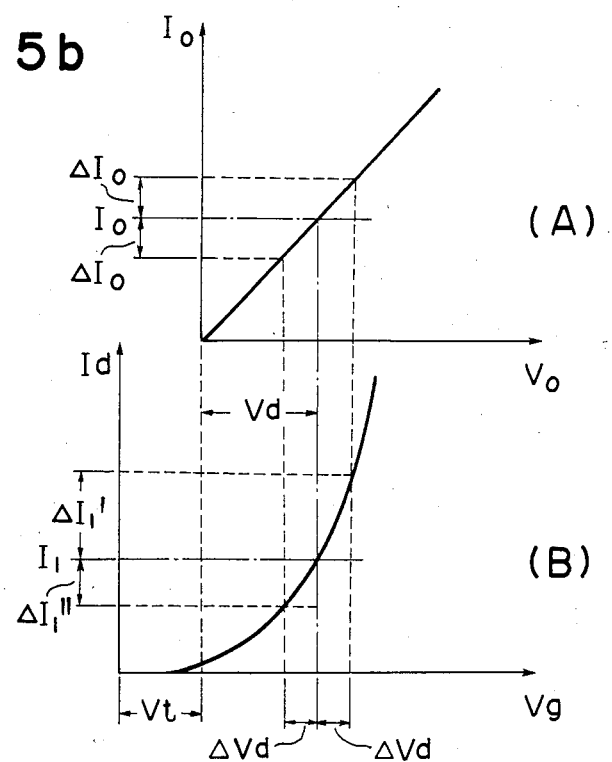

The current amplifying operation will be described in more detail using FIG. 5b. The figure shows in section (A) the voltage vs. current characteristics of the current detecting resistors R50 and R51, and in section (B) the voltage vs. current characteristics of the voltagecurrent converting transistors M55 and M56. The input voltages of the voltage-current conversion circuit 32 is offset from the output voltages of the current detection circuit 2 by the amount substantially equal to Vt through the level shift circuit 31, and the graph (B) is displaced leftward by this amount with respect to graph (A). The current detecting resistors R50 and R51 detect the input currents Io±ΔIo as voltages Vd±ΔVd, which are applied to the transistors M55 and M56 after being level shifted, then converted to currents I1+ΔI1′ and I1−ΔI1″ as shown in the figure. Since the mutual conductance of MOS transistor increases in proportion to the root of the drain current, the value $\Delta I1 = \Delta I1' + \Delta I1'' = g_{m2}\Delta V1$ converted from the current detection voltage $\Delta Vd = \Delta Io \cdot R50$ provided by resistors R50 and R51 results in ΔIo/Io<ΔI1/I1, namely the variable component of the current is amplified.

The output currents of the current amplifying circuit 3 are converted into voltages by resistors R52 and R53, and further amplified by the current mirror output buffer circuit 41 made up of MOS transistors M57-M60. The gate voltage of the transistors M59 and M60 that is the input of the output buffer circuit 41 can be varied across the threshold voltage Vt of M59 and M60 through the proper selection of the output current of the current amplifying circuit 3 and the value of resistors R52 and R53. Namely, for the resistors R52 and R53 with a value of R52r, the input gate voltage $V_{g60}$ of M59 and M60 in the output buffer circuit 41 becomes:

$$V_{g60} = (I_1 + \Delta I_1')R_{52r} = V_{g60}'$$

$$V_{g60} = (I_1 - \Delta I_1'')R_{52r} = V_{g60}''$$

and by setting the values of current I1 and resistor R52r appropriately, the gate voltage can be made:

$$V_{g60}'' < Vt < V_{g60}'$$

Accordingly, when the transistor M59, for example, has a gate voltage of $V_{g60}''$, it is cut off and, subsequently, transistors M57 and M58 forming a current mirror circuit have a mutual conductance $g_m$ and channel conductance $g_d$ of zero, i.e., the cut-off state. On the other hand, the transistor M60 has a gate voltage of $V_{g60}'$ at this time, and it becomes conductive, causing the output voltage Vo to go almost zero. Conversely, when the transistor M59 has a gate voltage of $V_{g60}'$, the transistors M57 and M58 forming a current mirror circuit become to have a finite value of channel conductance $g_d$, i.e., the conductive state. The gate voltage of M60 is in a differential relationship with that of M59, making it cut off b $V_{g60}''$, and the output voltage Vo becomes substantially equal to the power voltage $V_{CC}$. Accordingly, the transistors M59 and M60 can be operated in switching mode, whereby the amplitude of the output voltage Vo can be stretched to the span of power voltages.

This embodiment allows much freedom of choosing the detection voltage of the current detection circuit 2, so that the current amplifying circuit 3 can operate intensively to amplify the variable component of its input. In addition, even in case the input voltage is too small for the voltage-current conversion circuit 1 to operate in switching mode, the operation can eventually be brought to switching mode in the final current-voltage conversion stage 4, whereby the output voltage can have a swing substantially equal to the span of power voltages, that is sufficient to form a digital signal.

EMBODIMENT 4

Figure 6:
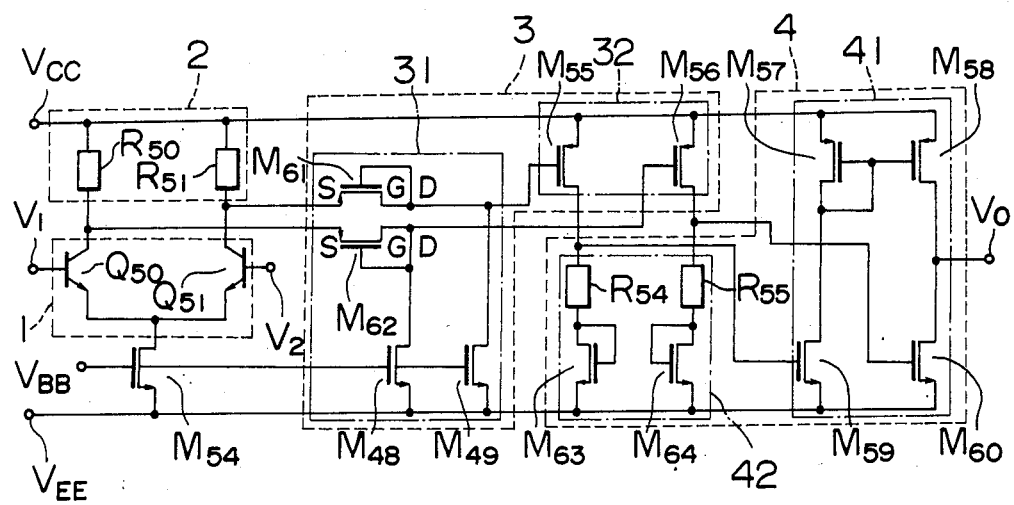
FIG. 6 is a schematic diagram showing still another embodiment of the invention.

FIG. 6 shows the fourth embodiment of the invention, in which the same or equivalent components as those shown in FIG. 4a are referred to by the common symbols. In this arrangement, a voltage level shift circuit 31 in the current amplifying circuit 3 is formed of a MOS diodes M61 and M62. Namely, MOS transistors M61 and M62 with each gate (G) and drain (D) coupled together are connected between the outputs of the current detection circuit 2 formed of resistors R50 and R51 and the gates of the voltagecurrent converting transistors M55 and M56 in the current amplifying circuit 3, so that by being biased through the constant current sourcing transistors M48 and M49 the same current amplifying operation as of the embodiment in FIG. 5a can be accomplished. In this case, by using the MOS transistors M61 and M62 of the same conductivity type as of the output transistors M55 and M56 forming the voltage-current conversion circuit 32, the effect of displarity of the threshold voltage Vt due to the manufacturing process can be alleviated.

In addition, through the connection of the transistors M61 and M62 forming diodes on their source (S) side to the load lines of the resistors R50 and R51, the load to the current detection circuit 2 can be reduced as compared with the embodiment of FIG. 4a.

The transistors M55 and M56 of the current amplifying circuit 3 are loaded by a connection of a resistor R54 and MOS transistor M63 in diode connection and a connection of a resistor R55 and MOS transistor M63 in diode connection, respectively, to form a level shift circuit 42. By this circuit, the voltage at the node of M55 and R54 and the node of M56 and R55 in the current-voltage conversion circuit 4 can be shifted by the amount substantially equal to the threshold voltage of M61 and M62, whereby the transistors M59 and M60 in the output buffer circuit 41 can have an increased input gate voltage. This allows the transistors M59 and M60 in the output buffer circuit 41 to operate in a region of large mutual conductance $g_m$, thereby lowering the output impedance of the level converter. The MOS transistors M59 and M60 in diode connection in FIG. 6 may be replaced with bipolar diodes.

EMBODIMENT 5

Figure 7:
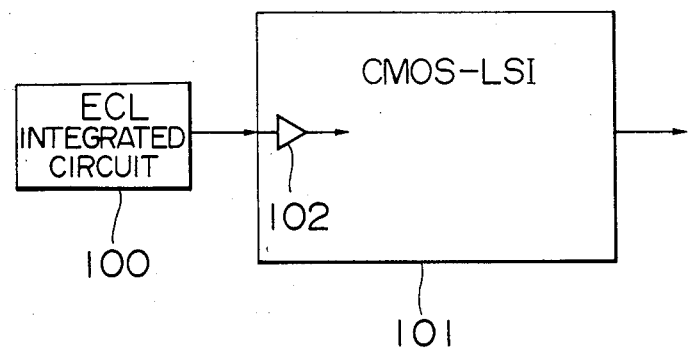
FIG. 7 is a block diagram showing the application system relevant to the present invention.
Figure 8:
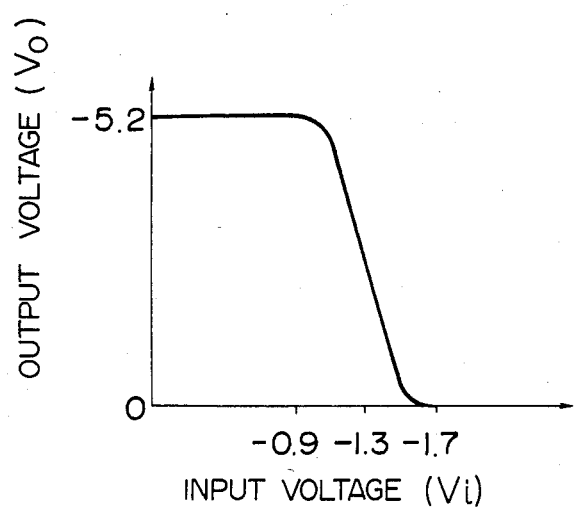
FIG. 8 is a graph showing the level converting characteristics of the level converter shown in FIG. 7.

FIG. 7 shows a system including an ECL integrated circuit 100 and an LSI 101 which has the ECL level interface and operates internally by the CMOS structure. The LSI 101 is provided therein with an ECL-CMOS level converter 102 as the interface for ECL inputs. The input-output characteristics required of the level converter 102 with a power voltage of −5.2 V is shown in FIG. 8, where the output voltage Vo is plotted on the horizontal axis against the input voltage Vi on the vertical axis. The ECL input voltage Vi ranges about −1.3 V±0.4 V, and the role of the level converter 102 is to transform such input voltage Vi into output voltage Vo with an amplitude substantially equal to the span of power voltage ($V_{CC} - V_{EE}$).

Figure 9:
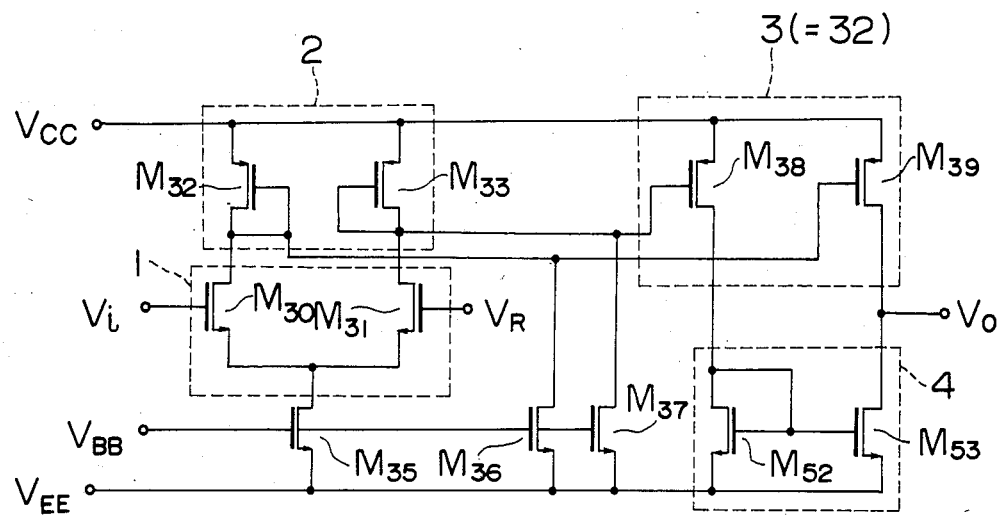
FIGS. 9 through 12 are schematic diagrams showing further embodiments of the present invention.

FIG. 9 shows the fifth embodiment of the invention, and it is a specific embodiment to be applied to the ECO-CMOS level converter as shown in FIG. 7. In FIG. 9, the same or equivalent components as shown in FIG. 3a or 4a are referred to by the common symbols, and a reference voltage of about $-1.3$ V is denoted by $V_R$ and the input voltage is denoted by Vi.

This level converter is not required to have a large voltage gain because of its relatively large input voltage amplitude, but the prime requisite is the operational speed. This embodiment meets the requirement, and the arrangement consists of MOS transistors M30 and M31 forming a voltage-current conversion circuit 1, MOS transistors M32 and M33 forming a current detection circuit 2, MOS transistors M38 and M39 forming a current amplifying circuit 3, and MOS transistors M52 and M53 forming a current-voltage conversion circuit 4.

All of the above circuits are formed substantially in a single device, so that the inter-circuit connection is minimized in length. The current detection circuit 2 operates to detect a small voltage swing. On this account, the drain junction capacitance of M32, M33, M36 and M37 and parasitic capacitance such as the gate capacitance of M38 and M39, and the input mirror capacitance cause extremely small delay of the level converter.

EMBODIMENT 6

Figure 10:
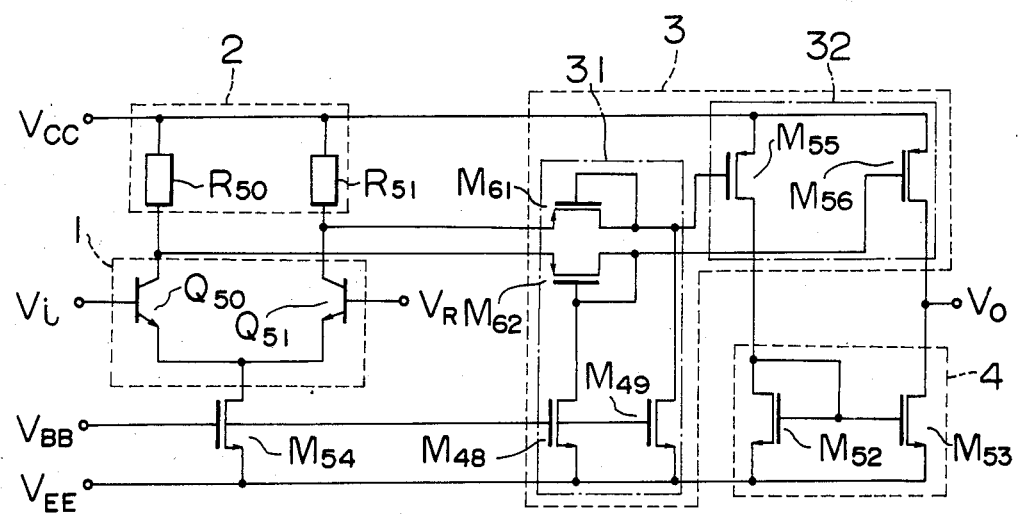

FIG. 10 shows the sixth embodiment of the invention, and it is a modified version of the ECL-CMOS level converter. In FIG. 10, the same or equivalent components as those shown in FIG. 4a, 6 or 9 are referred to by the common symbols. This embodiment uses bipolar transistors for the voltage-current conversion circuit 2, making the impedance of the differential input stage smaller, and thus allowing a speed-up of the input stage. A large input to MOS transistors M55 and M56 in the voltagecurrent conversion circuit 32 (the detected voltage by the current detection circuit 2 plus the shifted voltage by the level shift circuit 31) allows M55 and M56 to operate in a region of their large mutual conductance $g_m$, whereby the delay in the voltage-current conversion circuit 32 and current-voltage conversion circuit 4 constituting in combination the output stage 4 can also be reduced.

EMBODIMENT 7

Figure 11:
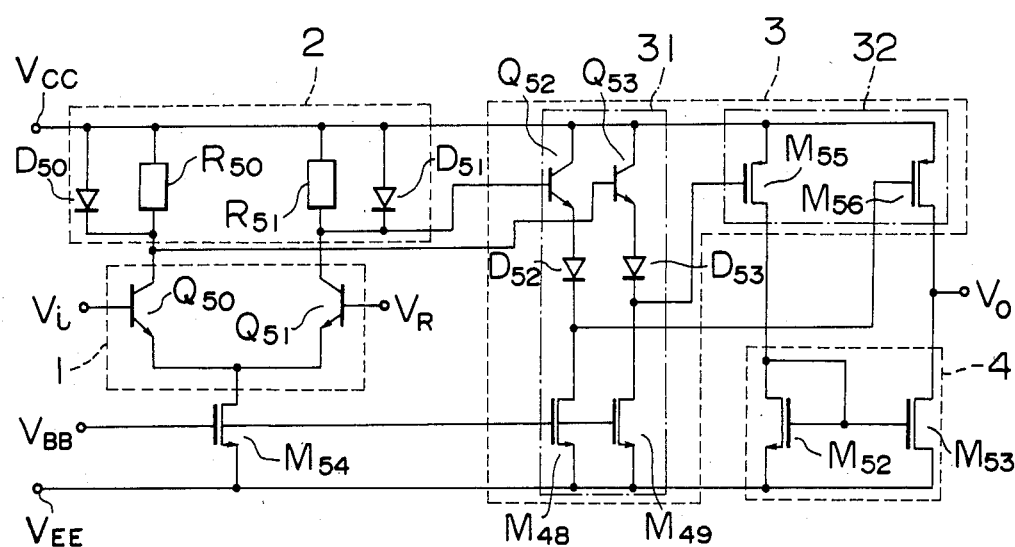

FIG. 11 shows the seventh embodiment of the invention, and it is also a modified version of the ECL-CMOS level converter. In the figure, the same or equivalent components as those shown in FIGS. 4a, 5a, 9 or 10 are referred to by the common symbols. In this embodiment, a parallel connection of a resistor R50 and diode D50 and another parallel connection of a resistor R51 and diode D51 constitute a set of current detection circuit 2, and bipolar transistors Q52 and Q53, diodes D52 and D53, and MOS transistors M48 and M49 in combination form a set of level shift circuit 31 used in the current amplifying circuit 3.

The use of the above-mentioned current detection circuit 2 allows the clamping of its output voltage, thereby preventing the level shifting bipolar transistors Q52 and Q53 in the voltage-current conversion circuit 3 from being saturated. In addition, the use of emitter followers made of bipolar transistors in the level shift circuit 31 attains a substantially constant level shift voltage without relaying upon the bias current, whereby the current gain can readily be controlled.

EMBODIMENT 8

Figure 12:
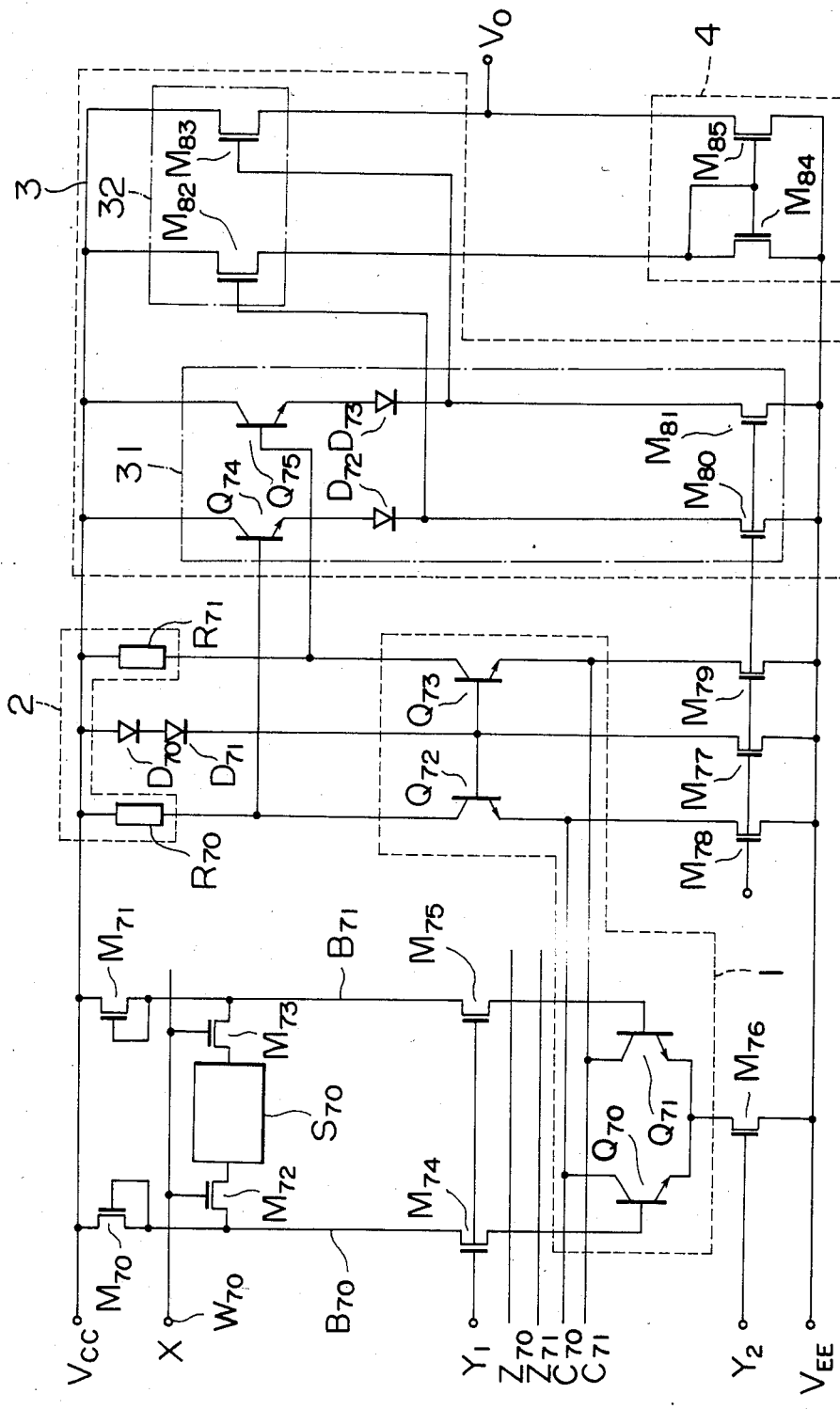

FIG. 12 shows the eighth embodiment of the invention, which is applied to the memory sense amplifier. In the figure, symbol S70 denotes a memory circuit made of a flip-flop or the like, and M72 and M73 are switching elements for selecting the S70. The memory circuit S70 and the switching elements M72 and M73 in combination form a memory cell. M70 and M71 are MOS transistors used to pull-up bit lines B70 and B71; W70 is a word line; M74 and M75 are Y1-select MOS transistors for selecting the bit lines B70 and B71; Q70 and Q71 are the first set of npn bipolar transistors in differential configuration forming a voltage-current conversion circuit 1; and Z70 and Z71 are common data lines to which are connected multiple sets of bit lines through respective Y1-select MOS transistors, and suply input voltages to the base of the above-mentioned voltage-current converting transistors Q70 and Q71. M76 is a MOS transistor providing a bias current for the bipolar transistor set Q70 and Q71; Y2 is a signal line (Y2-select) for selecting a first set of differential npn bipolar transistors Q70 and Q71 in multiple sets of voltage-current conversion circuit 1 connected to the common data line; and Q72 and Q73 are npn bipolar transistors forming a grounded-base cascade stage supplied with the output current of Q70 and Q71 and biased by a constant voltage, the npn bipolar transistors Q70–Q73 altogether constituting a complete voltage-current conversion stage 1.

Diodes D70 and D71 form a bias circuit for the grounded-base cascade stage, and resistors R70 and R71 form a current detection circuit 2. Q74, Q75, D72 and D73 are emitter followers of npn bipolar transistors and associated diodes forming a level shift circuit 31 for the current indicating voltages detected by R70 and R71. M82 and M83 are current amplifying MOS transistors forming a voltage-current conversion circuit 32; M84 and M85 are MOS transistors in mirror configuration constituting a current-voltage conversion circuit 4; and M77–M81 are MOS transistors providing constant bias currents for the respective circuit components.

In this embodiment, the voltage-current conversion circuit 1 is formed in the cascade arrangement of bipolar transistors, and almost no mirror effect is created in the input stage. Accordingly, the input capacitance can be made extremely small, whereby the delay time caused by the signal source resistance and input capacitance can be reduced significantly.

The bipolar transistors Q70–Q73 forming the cascade stage may be replaced with MOS transistors. The above current detection circuit 2, current amplifying circuit 3, and voltage-current conversion circuit 4 may otherwise be arranged in any form described in the preceding embodiments. ments.

As can be seen from the foregoing description of several embodiments, the input differential stage is made up of a voltage-current conversion circuit 1 and a current detection circuit 2, and it does not aim at amplifying the voltage. Accordingly, the voltage gain is extremely small, and the mirror effect on the input capacity can be ignored. Consequently, the delay time in the input circuit which is mainly caused by the signal source impedance and the input capacitance can be reduced significantly.

It is required of the output circuit to have a low output impedance so as to minimize the delay time in driving a capacitive load, and to have a large amplitude of output voltage. On this account, the internal amplification is performed by the current amplifying circuit 3 which deals with voltages of small amplitude in each section, particularly, in the high-impedance circuit section near the input stage. This arrangement can minimize the delay time created by the internal parasitic capacitance and resistance components.

As described above, the present invention provides a level converting circuit capable of fast operation and drastic level conversion.

We claim:

1. A level converting circuit for transforming differential input voltages into an output voltage comprising:
   voltage-to-current conversion means for transforming said differential input voltages into differential currents;
   current detection means coupled to said voltage-to-current conversion means for detecting said differential currents and providing a voltage output corresponding to said detected differential currents;
   current amplifying means coupled to said current detection means for amplifying said voltage output of said current detection means and producing a current output corresponding to said amplified voltage output of said current detection means; and
   current-to-voltage conversion means coupled to said current amplifying means for transforming and combining said current output of said current amplifying means into an output voltage.

2. A level converting circuit according to claim 1, wherein said current detection means or said current amplifying means comprises a current mirror circuit.

3. A level converting circuit according to claim 1, wherein said voltage-to-current conversion means comprises MOS transistors or bipolar transistors.

4. A level converting circuit according to claim 1, wherein said voltage-to-current conversion means comprises a cascade stage formed of a bipolar transistor or MOS transistor receiving said differential current and biased on its base or gate electrode by a constant voltage.

5. A level converting circuit according to claim 1, wherein said current detection means comprises a MOS transistor with its gate and drain electrodes having an equal voltage to form an equivalent diode.

6. A level converting circuit according to claim 1, wherein said current detection circuit comprises a resistor.

7. A level converting circuit according to claim 1, wherein said current detection means comprises a parallel combination of a resistor and a diode.

8. A level converting circuit according to claim 1, wherein said current amplifying means comprises a level shift circuit and/or a voltage-to-current conversion circuit.

9. A level converting circuit according to claim 8, wherein said level shift circuit comprises a MOS transistor with its source electrode connected to the output of said current detection means and its drain and gate electrodes connected to the output of said level shift circuit.

10. A level converting circuit according to claim 8, wherein said level shift circuit comprises -an emitter. follower made of a bipolar transistor.

11. A level converting circuit according to claim 8, wherein said voltage-to-current conversion circuit comprises a MOS transistor.

12. A level converting circuit according to claim 1, wherein said current-to-voltage conversion means comprises a mirror circuit.

13. A level converting circuit according to claim 1, wherein said current-to-voltage conversion means comprises a level shift circuit and an output buffer circuit.

14. A level converting circuit according to claim 1, wherein said output voltage is a CMOS drive voltage signal.

15. A level converting circuit according to claim 14, wherein said differential input voltages are ECL voltage level signals.

* * * * *